US008184442B2

(12) United States Patent
Fujimura et al.

(10) Patent No.: US 8,184,442 B2
(45) Date of Patent: May 22, 2012

(54) CASE OF AN ELECTRONIC DEVICE

(75) Inventors: Mitsuo Fujimura, Kawasaki (JP); Hideo Araki, Kawasaki (JP); Katsuhiko Ikeda, Kawasaki (JP); Yoshiyuki Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 53 days.

(21) Appl. No.: 12/607,257

(22) Filed: Oct. 28, 2009

(65) Prior Publication Data

US 2010/0103633 A1 Apr. 29, 2010

(30) Foreign Application Priority Data

Oct. 29, 2008 (JP) ................................ 2008-278531

(51) Int. Cl.
*H05K 5/00* (2006.01)

(52) U.S. Cl. ........ 361/756; 361/759; 361/796; 439/76.1

(58) Field of Classification Search .................. 361/756, 361/759, 796; 439/76.1, 64, 377

See application file for complete search history.

(56) References Cited

U.S. PATENT DOCUMENTS

| | | | | |
|---|---|---|---|---|
| 4,247,882 | A * | 1/1981 | Prager et al. | 361/679.4 |
| 7,140,885 | B2 * | 11/2006 | Kitamura | 439/76.1 |
| 2006/0044775 | A1 * | 3/2006 | Hoshino et al. | 361/796 |
| 2010/0046181 | A1 * | 2/2010 | Barrett et al. | 361/756 |

FOREIGN PATENT DOCUMENTS

| | | | |
|---|---|---|---|
| JP | H09-181467 | A | 7/1997 |
| JP | 2005-26388 | A | 1/2005 |

* cited by examiner

*Primary Examiner* — Yuriy Semenenko
*Assistant Examiner* — Andargie M Aychillhum
(74) *Attorney, Agent, or Firm* — Fujitsu Patent Center

(57) ABSTRACT

A case for an electronic device includes a printed circuit board; a frame capable of storing the printed circuit board; a back board equipped on a back side of the frame, and including a connector for connecting the printed circuit board; rail holders equipped in predetermined positions of the frame and extending from a front side of the case to the back board; and guide rails engaged with the rail holders respectively and including engagement parts capable of engaging with the rail holders respectively, and holding parts for holding both ends of the frame, and extending in accordance with the rail holders, respectively.

16 Claims, 19 Drawing Sheets

10a

10b

10c

10c

110

110a

CASE OF AN ELECTRONIC DEVICE

CROSS-REFERENCE TO RELATED APPLICATION

This application is based upon and claims the benefit of priority of the prior Japanese Patent Application No. 2008-278531, filed on Oct. 29, 2008, the entire contents of which are incorporated herein by reference.

FIELD

The embodiments discussed herein are related to a case of an electronic device.

BACKGROUND

In various electronic devices including communication devices, the electronic devices are configured by housing a plurality of printed circuit boards mounting electronic circuits performing various signal processing in a case of the electronic devices.

To date, a structure in which guide rails incapable of being removed are provided in a case of an electronic device, and in which printed circuit boards are held and housed between the guide rails has been used as the case of the electronic device housing the plurality of printed circuit boards. FIG. 1 is a front view illustrating positions at which printed circuit boards are housed in a conventional case of an electronic device.

As illustrated in FIG. 1, a case 1 of an electronic device includes a plurality of guide rails 5*a* to 5*c* provided in the inside of a frame 2 configuring the case of the electronic device, the guide rails 5*a* to 5*c* being incapable of being removed and extending from a front surface toward a back surface of the frame 2. The guide rails 5*a* to 5*c* include holding parts 7 provided on one side or both sides of the guide rails 5*a* to 5*c*, the holding parts 7 extending from the front surface toward the back surface of the frame 2 and sandwiching and holding side edges of the printed circuit boards 6. One printed circuit board 6 is housed by being held between any two of the guide rails 5*a* to 5*c* and connected to a backboard 3 through a connector 4 in a state in which side edges on both of right and left sides of the printed circuit board 6 are held by the holding parts 7 provided on two guide rails.

However, depending on an electronic device, printed circuit boards having different substrate sizes (width dimensions of substrates) or different substrate thicknesses may need to be used. In such a situation that an electronic device is configured by using printed circuit boards having different sizes, a case corresponding to the printed circuit boards having different substrate sizes and different substrate thicknesses has been designed and arranged.

On the other hand, a case of an electronic device is known in which printed circuit boards having different substrate sizes (width dimensions of substrates) or different substrate thicknesses can be held by changing attachment positions of guide rails. Above all, a case of an electronic device is known in which guide rails can be attached to arbitrary positions depending on the sizes of printed circuit boards (for example, see Patent Documents 1 and 2).

For example, an example of a module system frame housing a module substrate is known. In the example of this module system frame, supporter parts compartmentalizing the space among facing outside wall parts and wall parts can hold the module substrates. Additionally, the dimensions of the supporter parts are variable including the absence or presence, and the sizes of the module substrates capable of being held are variable.

Additionally, an example of a communication device shelf is also known in which an intermediate guide rail is attached in an arbitrary position depending on the size of a printed circuit board. In this example, the communication device shelf houses a plurality of large and small plug-in electronic circuit packages having different substrate heights. The communication device shelf includes a plurality of partition plates dividing the inside of the shelf into a number of functional blocks. Additionally, the communication device shelf includes an intermediate guide between the adjacent partition plates, at a predetermined position in a height direction of the partition plate. The intermediate guide is provided vertically, is supported by supporting means, and is removable with respect to the supporting means from a front surface of the shelf. Additionally, the intermediate guide includes substrate guidance grooves provided at a predetermined interval on both the main face and the reverse face, the substrate guidance grooves facing each other.

Japanese Laid-open Patent Publication No. 2005-26388 and Japanese Laid-open Patent Publication No. 09-181467 are background arts of this technical field.

However, in a small electronic device, when the electronic device is configured by performing connection between printed circuit boards having different substrate sizes and different substrate thicknesses through a backboard, there are situations as described below.

For example, the example of the module system frame has a structure in which unit supporters corresponding to guide rails are vertically stacked in a stack to configure a supporter part. Therefore, the stacked unit supporter may be not able to be separately attached and removed without removing other unit supporters. As a result, when one unit supporter is removed, a printed circuit board not directly supported by the unit supporter may also have to be removed. Then, when the printed circuit board is removed, power feeding to the electronic device may also have to be stopped.

Additionally, in the example of the shelf for communication to which the intermediate guide rail has been attached, a structure is included in which the plurality of printed circuit boards are attached to each intermediate guide corresponding to the intermediate guide rail. Therefore, the sizes of the adjacent printed circuit boards may not be able to be changed. Additionally, the intermediate guide has such a structure that the intermediate guide is inserted so as to put an intermediate guide-supporting pin in a back side of the case into a groove in a back side of the intermediate guide, and then is inserted so as to put an intermediate guide-supporting pin in the front surface side into a groove in a front surface side of the intermediate guide. Therefore, when the intermediate guide is attached and removed, the intermediate guide is inserted and removed while rotating around the intermediate guide-supporting pin in the back side of the case. Thereby, the intermediate guide may contact other members in the shelf including the printed circuit boards. As a result, when the intermediate guide is attached and removed, power feeding to the electronic device configured by the shelf for communication may also have to be stopped.

In accordance with an example, a position of a guide rail can be readily changed without stopping power feeding to an electronic device, and printed circuit boards having different sizes can be housed without newly designing a case.

SUMMARY

According to an aspect of the invention, a case for an electronic device includes a printed circuit board; a frame capable of storing the printed circuit board; a back board equipped on a back side of the frame, and including a connector for connecting the printed circuit board; rail holders equipped in predetermined positions of the frame and extending from a front side of the case to the back board; and guide rails engaged with the rail holders respectively and including engagement parts capable of engaging with the rail holders respectively, and holding parts for holding both ends of the frame, and extending in accordance with the rail holders, respectively.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Next, the best mode for carrying out the present invention will be described together with the drawings.

(First Embodiment)

First, with reference to FIGS. 2 to 7, a case of an electronic device according to a first embodiment will be described.

Figure 1:
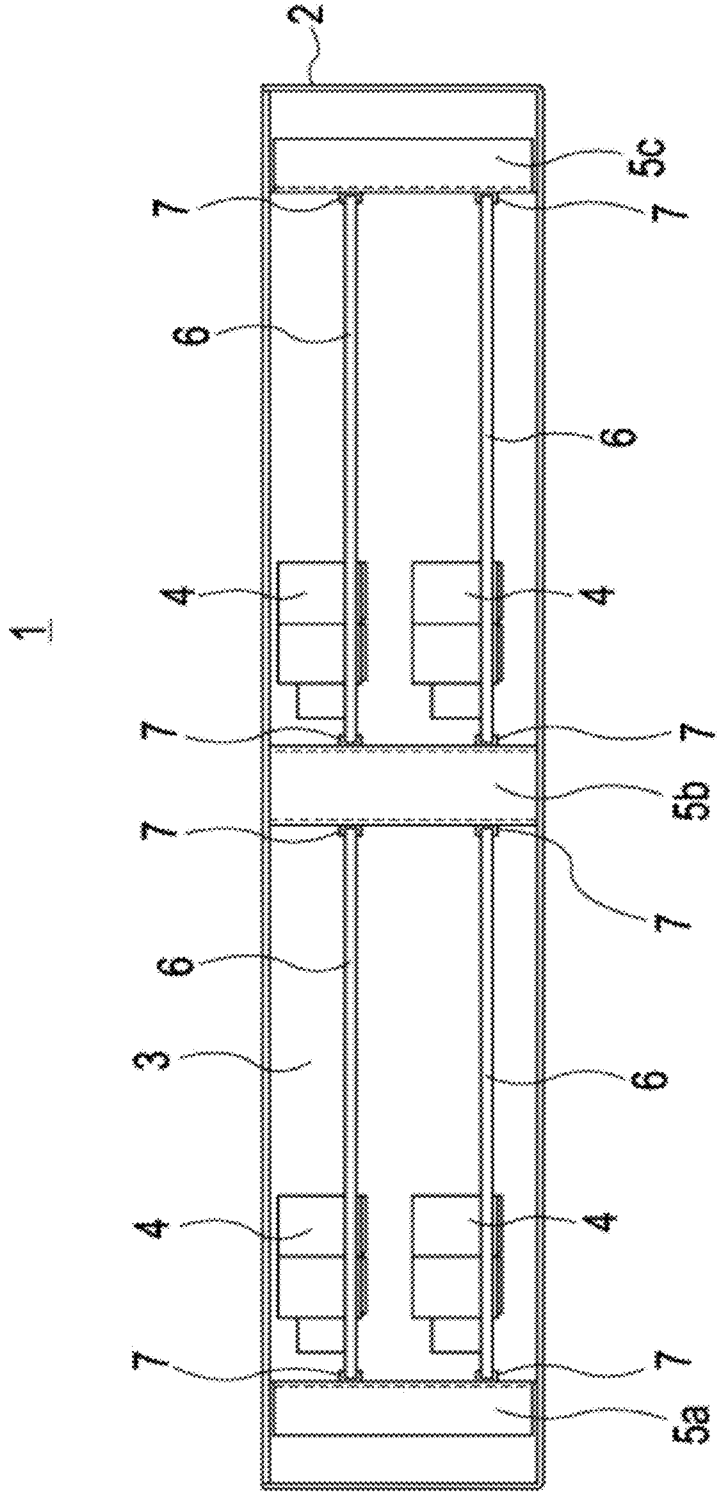
FIG. 1 is a front view illustrating positions at which a conventional case of an electronic device houses printed circuit boards.
Figure 2:
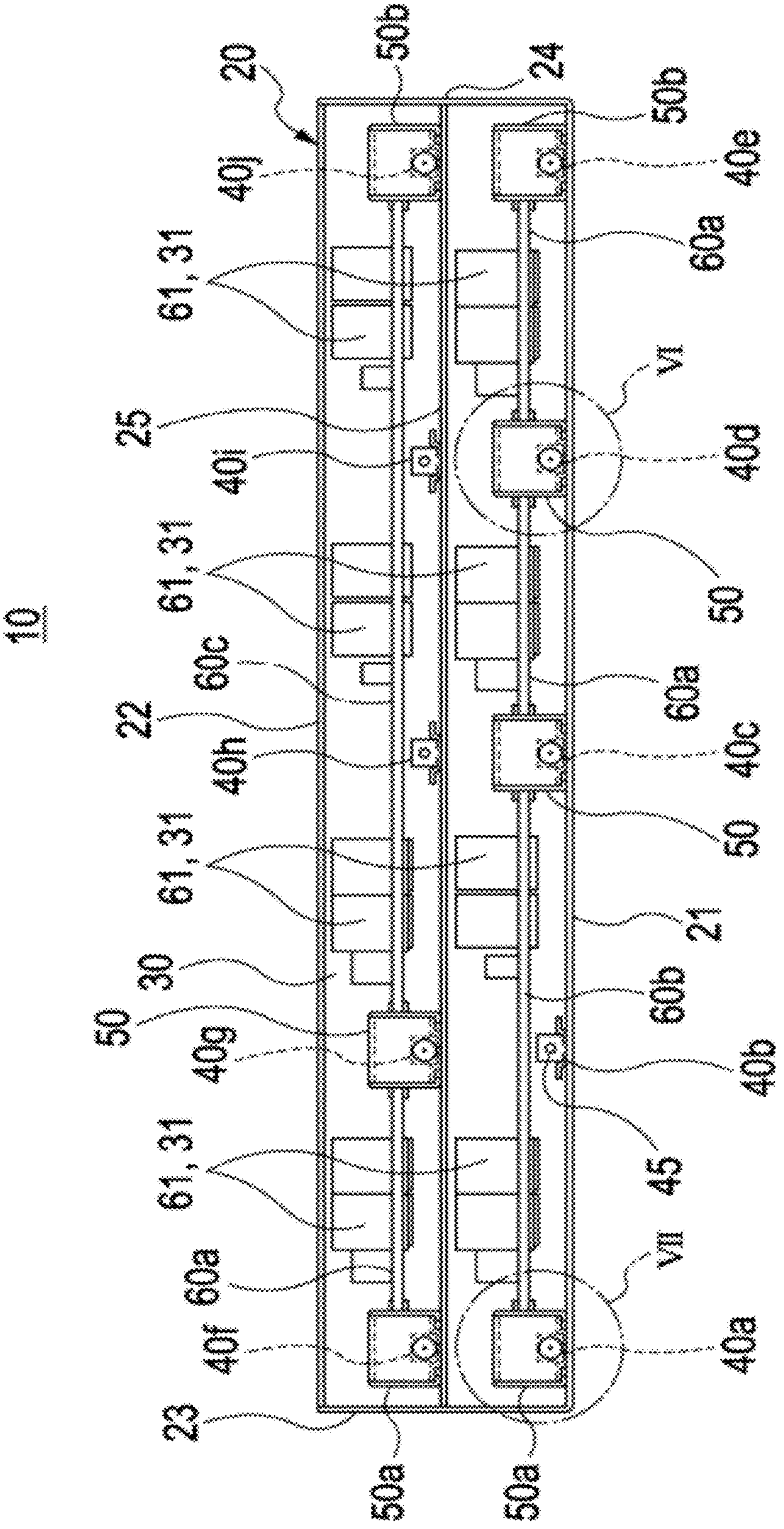
FIG. 2 is a front view illustrating a case of an electronic device according to a first embodiment of the present invention.
Figure 3:
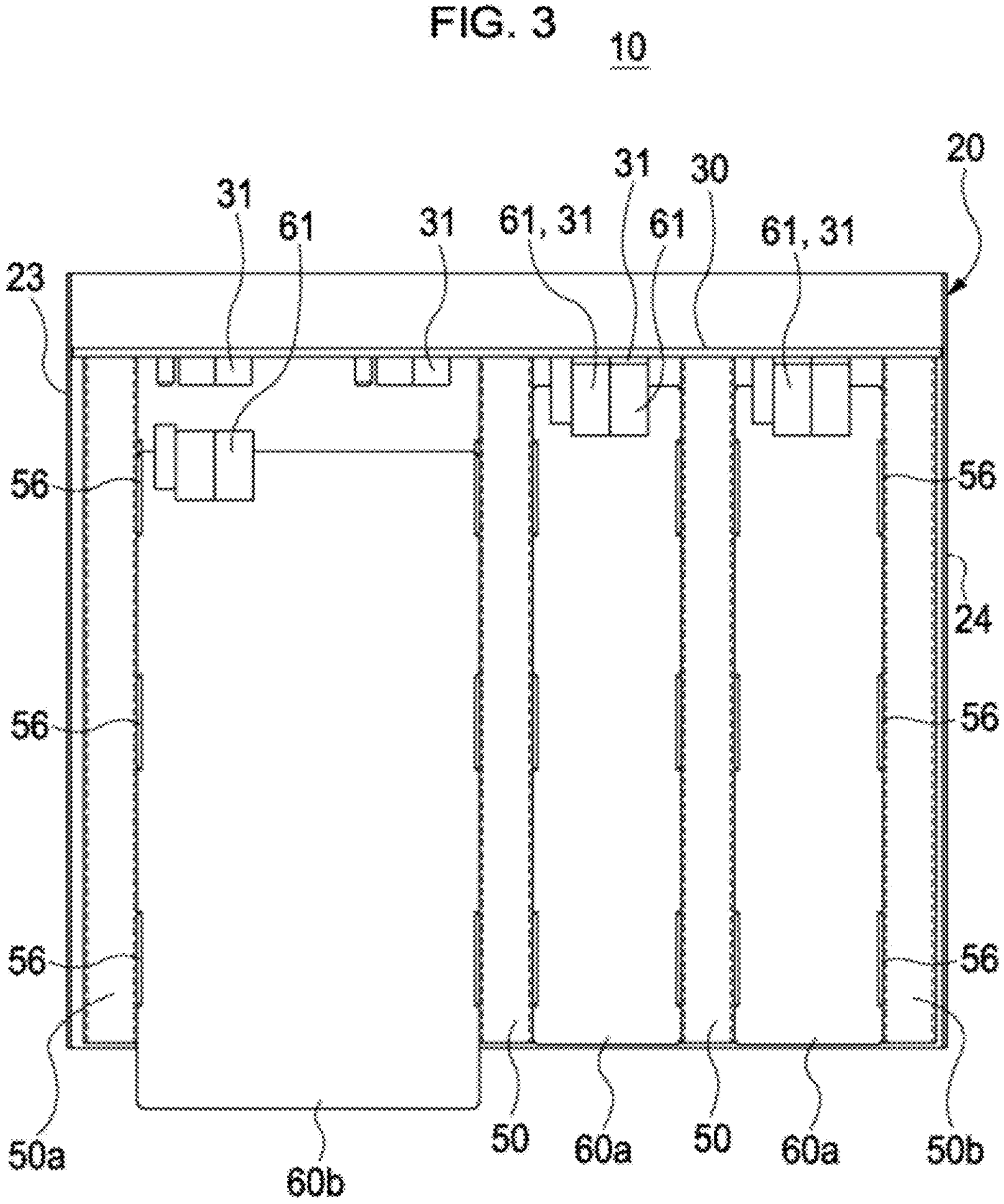
FIG. 3 is a plan view illustrating a configuration of a bottom surface part-side stage of the case of the electronic device illustrated in FIG. 2.
Figure 4:
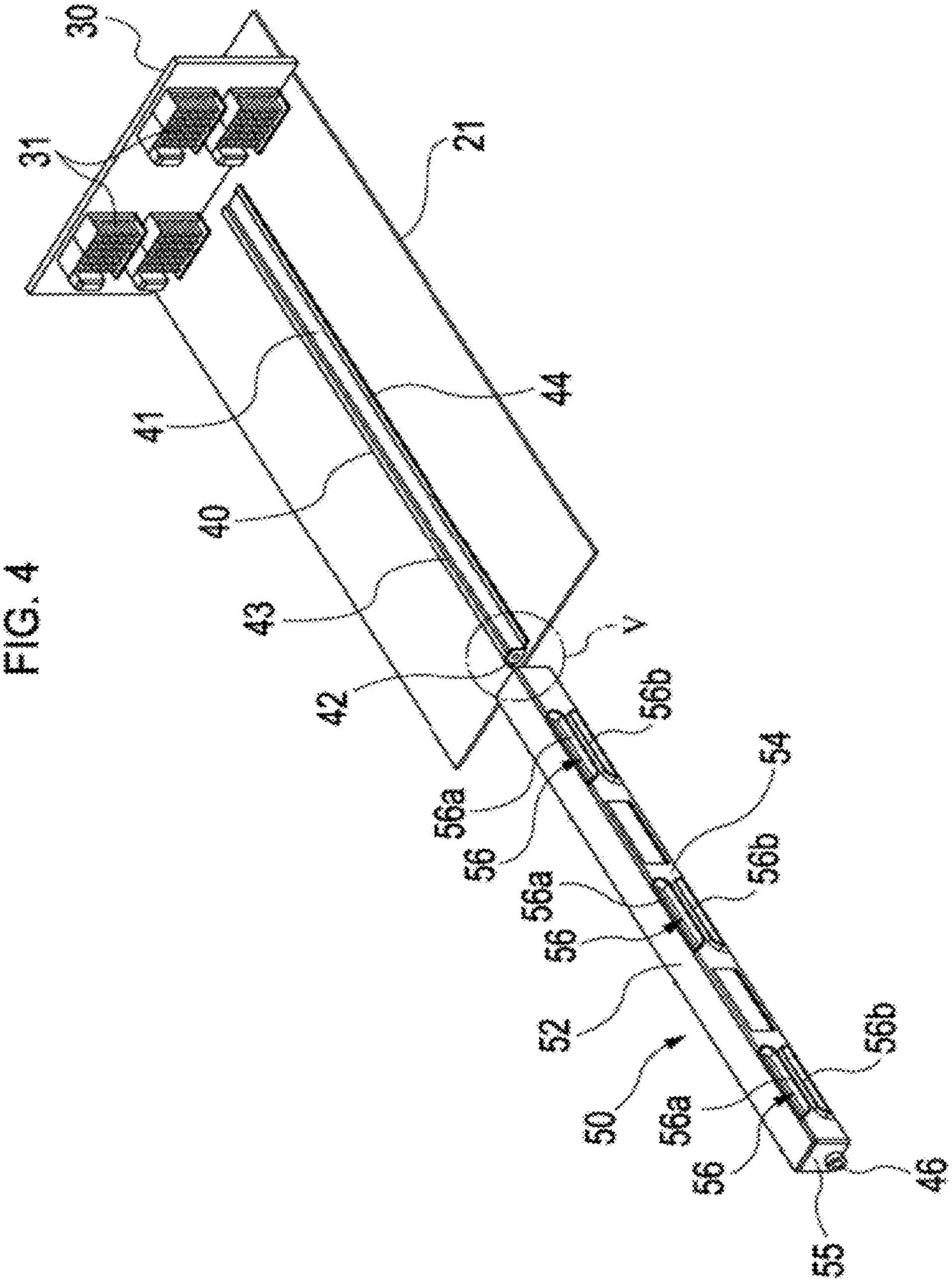
FIG. 4 is a detailed assembly diagram illustrating a part of the case of the electronic device illustrated in FIG. 2, including a rail holder and a guide rail.
Figure 5:
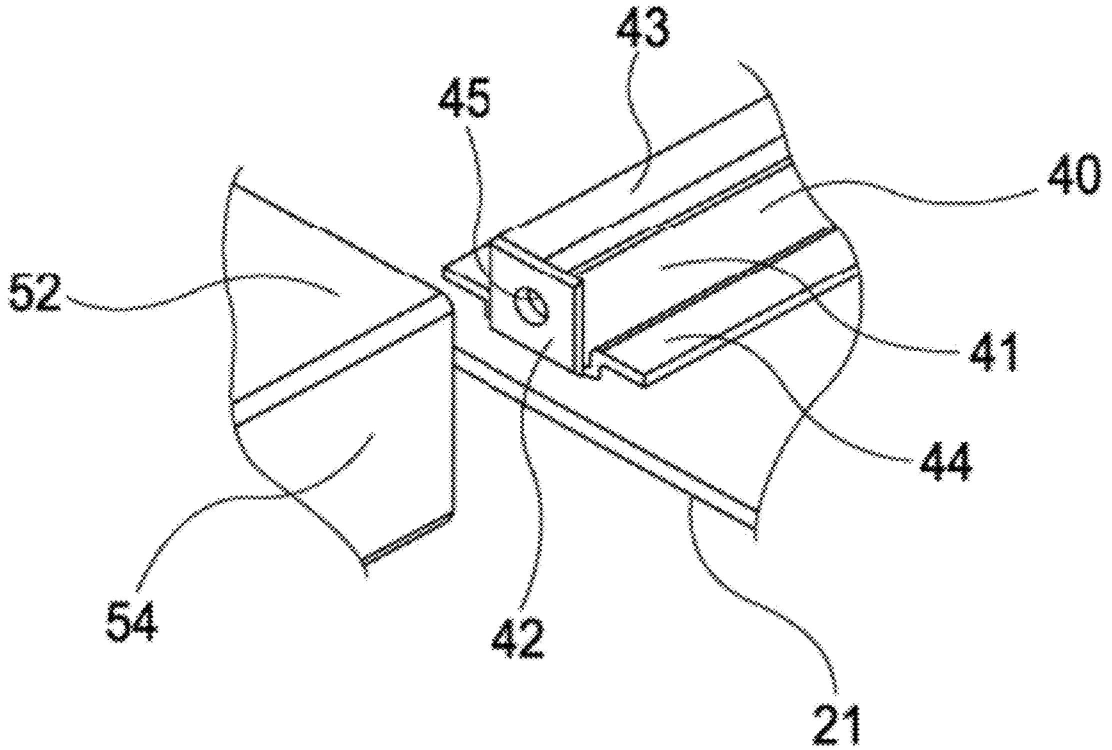
FIG. 5 is a view enlarging and illustrating a part surrounded by a circle V in FIG. 4.
Figure 6:
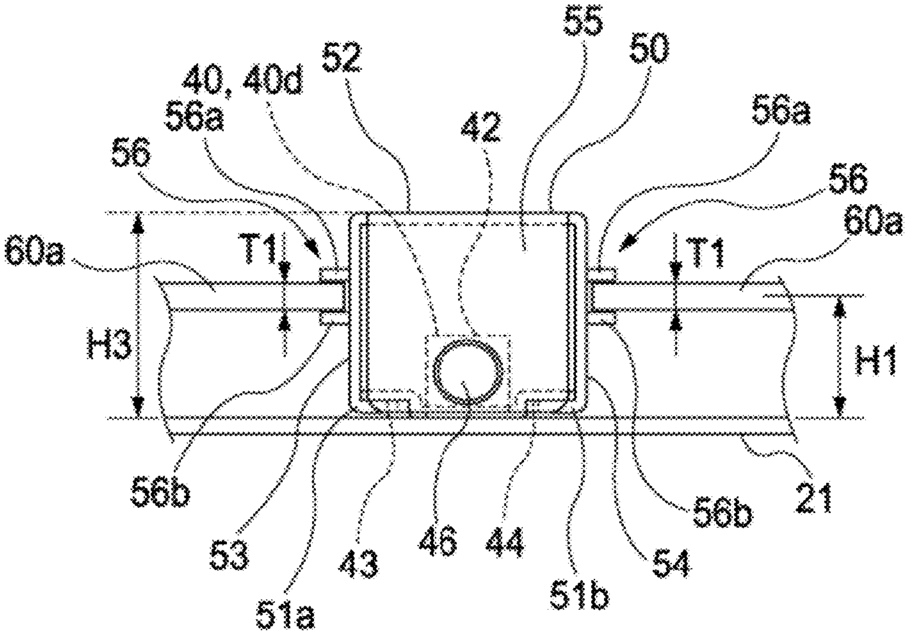
FIG. 6 is a view enlarging and illustrating a part surrounded by a circle VI in FIG. 2.
Figure 7:
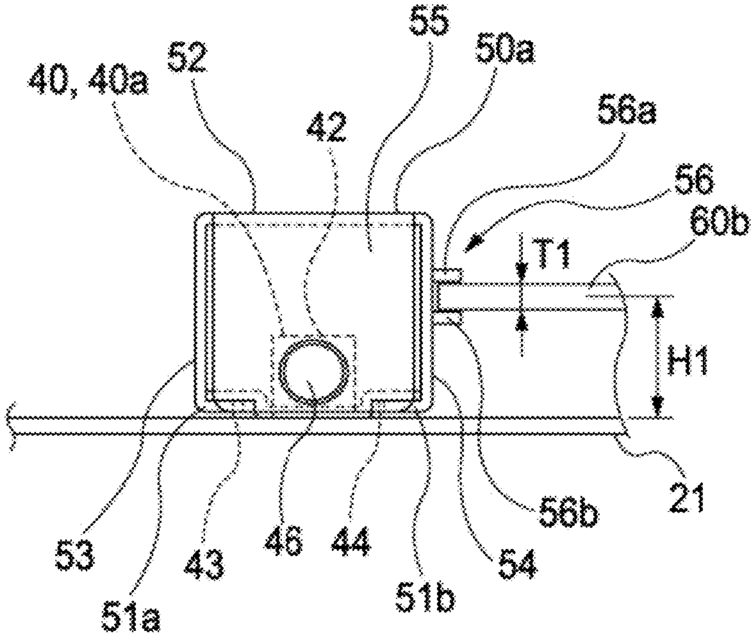
FIG. 7 is a view enlarging and illustrating a part surrounded by a circle VII in FIG. 2.

FIG. 2 is a front view illustrating the case of the electronic device according to this embodiment. FIG. 3 is a plan view illustrating a configuration of a bottom surface part-side stage of the case of the electronic device illustrated in FIG. 2. FIG. 4 is a detailed assembly diagram illustrating a part of the case of the electronic device illustrated in FIG. 2, including a rail holder and a guide rail. FIG. 5 is a view enlarging and illustrating a part surrounded by a circle V in FIG. 4. FIG. 6 is a view enlarging and illustrating a part surrounded by a circle VI in FIG. 2. FIG. 7 is a view enlarging and illustrating a part surrounded by a circle VII in FIG. 2.

With reference to FIGS. 2 and 3, the case 10 of the electronic device according to this embodiment includes a frame 20, a backboard 30, the rail holder 40, and the guide rail 50. Meanwhile, FIGS. 2 and 3 also illustrate a printed circuit board 60 housed by the case 10 of the electronic device. The printed circuit board 60 is held between the guide rails 50.

As illustrated in FIG. 2, the frame 20 has a substantially rectangular O-shaped cross-sectional shape. The frame 20 includes a bottom surface part 21, a top surface part 22, and side surface parts 23 and 24. The frame 20 houses the printed circuit board 60 on which an electronic circuit is mounted.

The frame 20 also includes a partition plate 25. As illustrated in FIG. 2, the partition plate 25 is provided parallel to the bottom surface part 21 between the bottom surface part 21 and the top surface part 22 of the frame 20, and is a plate-like member partitioning the frame 20 into two stages. As illustrated by an example in FIG. 2, the partition plate 25 may also be provided so as to partition the frame 20 into two upper and lower stages. The partition plate 25 is provided so as to span as a bridge between upper and lower substantially center lines of respective surfaces of the side surface parts 23 and 24 facing each other in the frame 20.

Metals or other electric conductors such as a stainless steel plate, a plated steel plate, or an aluminum plate may be used as a material of the frame 20. A material of the partition plate 25 may also be similar to the frame 20. Additionally, since the frame 20 is grounded by wiring not illustrated in the drawing, the partition plate 25 is also grounded.

As illustrated in FIGS. 3 and 4, the backboard 30 is provided at a back surface of the frame 20. The backboard 30 is attached to the frame 20 by using a fixing member such as a screw not illustrated in the drawing. The backboard 30 includes a plurality of connectors 31 provided in rows in a front surface side of the frame 20. The connectors 31 are connecting terminals that connect the printed circuit board 60 to the backboard 30. The connectors 31 are provided in all positions between the adjacent rail holders 40. It is intended to connect all the printed circuit boards 60 to the backboard 30 when the guide rails 50 are held by all the rail holders 40, and the separate printed circuit boards 60 are held in all positions between the adjacent rail holders 40. As illustrated in FIG. 3, the connectors 31 of the backboard 30 are fitted with connectors 61 of the printed circuit board 60 to thereby connect the backboard 30 to the printed circuit board 60. FIG. 3 is an example illustrating a state before a printed circuit board 60*b* is connected to the backboard 30, and a state in which two printed circuit boards 60*a* are connected to the backboard 30.

As illustrated in FIG. 2, the plurality of rail holders 40 are provided in predetermined positions in the frame 20. When the frame 20 includes the partition plate 25, the plurality of rail holders 40 are provided in a row in each of a bottom surface part 21-side stage of the frame 20 and a partition plate 25-side stage of the frame 20. FIG. 2 illustrates a situation in which five rail holders 40 are provided in a row at substantially regular intervals as an example.

The plurality of rail holders 40 are provided at the predetermined positions in the frame 20, and extend from the front surface of the frame 20 toward the backboard 30. As illustrated in FIGS. 4 to 6, the rail holder 40 includes a bottom plate part 41, a front plate part 42, and engagement parts 43 and 44. The bottom plate part 41 extends from the front surface of the frame 20 toward the backboard 30, and is fixed on the bottom surface part 21 or on the partition plate 25 of the frame 20. The front plate part 42 is a member having a rectangular front shape, and is provided perpendicularly so as to be substantially parallel to the front surface of the frame 20 by bending the front surface side of the bottom plate part 41 of the frame 20 at a substantially right angle. The engagement parts 43 and 44 are members having a substantially L-shaped cross-sectional shape, and are provided by bending both of right and left sides of the bottom plate part 41 two times as viewed from the front surface of the frame 20. Parts of the engagement parts 43 and 44 substantially parallel to the bottom surface part 21 or the partition plate 25 of the frame 20 are provided so as to be spaced apart at a predetermined interval from the bottom surface part 21 or the partition plate 25 of the frame 20. The bottom plate part 41 is fixed on the bottom surface part 21 or the partition plate 25 of the frame 20 by, for example, fixation by a fixing member such as a bottom plate screw not illustrated in the drawing, adhesion, or welding. As illustrated in FIG. 5, the front plate part 42 is provided with a screw hole (tap hole) 45 in its center. The screw hole (tap hole) 45 is for screwing a front surface part 55 of the guide rail 50 by using a screw 46. The engagement parts 43 and 44 engage with engagement parts 51*a* and 51*b* of the guide rail 50.

The guide rail 50 is a member engaged so as to be slid and inserted into the rail holder 40, and extends from the front surface of the frame 20 toward the backboard 30 similarly to the rail holder 40. As illustrated in FIG. 6, the guide rail 50 has such a cross-sectional shape that a cutout is provided in the center of a base of a substantially rectangular O-shape. The guide rail 50 includes the engagement parts 51*a* and 51*b*, a top surface part 52, side surface parts 53 and 54, and the front surface part 55. The top surface part 52 is provided on a top surface of the guide rail 50, extends from the front surface of the frame 20 toward the backboard 30, and is a part having a long rectangular shape. The side surface parts 53 and 54 are provided on right and left side surfaces of the guide rail 50 as viewed from the front surface of the frame 20, extend from the front surface of the frame 20 toward the backboard 30, and are parts having a long rectangular shape. The engagement parts 51*a* and 51*b* are parts formed by cutting out the center of a bottom surface facing the top surface part 52 of the guide rail 50 along a direction from the front surface of the frame 20 toward the backboard 30. The front surface part 55 is provided on the front surface side of the frame 20 of the guide rail 50, and is a part having a rectangular front shape.

In the center of the front surface part 55, in order to screw the front surface part 55 to the screw hole (tap hole) 45 of the front plate part 42 of the rail holder 40 by using the screw 46, a hole not illustrated in the drawing is provided which has such a diameter that a head of the screw 46 does not come out and the screw 46 is engaged. As illustrated in FIGS. 4 and 6, the side surface parts 53 and 54 are provided with a holding part 56 pinching and holding a side edge of the printed circuit board 60 between both the main face and the reverse face of the printed circuit board. As illustrated in FIG. 4, the holding part 56 is provided with a pair of holding members 56*a* and 56*b* provided on the side surface parts 53 and 54 from the front surface of the frame 20 toward the backboard 30 so as to face each other at an interval corresponding to the substrate thickness of the printed circuit board 60. As illustrated in FIG. 4, the holding part 56 may also be provided so as to be divided into a plurality of pieces along a direction from the front surface of the frame 20 toward the backboard 30. Additionally, as illustrated in FIGS. 2 and 7, in guide rails provided at both ends among the plurality of guide rails provided in a row in a lateral direction on the bottom surface part 21 or the partition plate 25 of the frame 20, the holding part 56 is provided on only one of the side surface parts 53 and 54, and is not provided on the other. In FIGS. 2 and 7, these guide rails at both ends are illustrated as 50*a* (left end) and 50*b* (right end).

Now, a method for fixing and holding the guide rail 50 on the rail holder 40, and operation and effect with which the case 10 of the electronic device can house printed circuit boards having different sizes will be described.

As illustrated in FIG. 4, the guide rail 50 is slid and inserted from the front surface side of the frame 20 in such a state that the engagement parts 51*a* and 51*b* of the guide rail 50 are engaged between the engagement parts 43 and 44, respectively, of the rail holder 40 and the bottom surface part 21 or the partition plate 25 of the frame 20. Then, the guide rail 50 is slid and inserted until the front surface part 55 abuts on the front plate part 42 of the rail holder 40. In a state in which the front surface part 55 abuts on the front plate part 42 of the rail holder 40, the screw 46 penetrates a through-hole, not illustrated in the drawing, having such a diameter as to engage the head, and is screwed to the screw hole (tap hole) 45 of the front plate part 42 from the front surface of the front surface part 55.

Additionally, the guide rails 50 do not have to be attached to all the rail holders 40. For example, as illustrated in FIG. 2, in five rail holders 40*a*, 40*b*, 40*c*, 40*d*, and 40*e* provided on the bottom surface part 21 of the frame 20, the guide rail 50 does not have to be provided on one rail holder 40*b*. Additionally, as illustrated in FIG. 2, in five rail holders 40*f*, 40*g*, 40*h*, 40*i*, and 40*j* provided on the partition plate 25 of the frame 20, the guide rails 50 do not have to be provided on two rail holders 40*h* and 40*i*. It is determined which of the rail holders 40 preliminarily provided on predetermined positions are to be engaged with the guide rail 50, on the basis of the width dimension of the printed circuit board 60 housed in the frame 20.

In the case of providing five rail holders 40 at substantially regular intervals as illustrated in FIG. 2, when the width dimension of the printed circuit board 60 corresponding to the full width of the frame 20 is set as a size of 1, the printed circuit boards 60 having four kinds of sizes of ¼, ½, ¾, and 1 can be combined. The ¼, ½, and ¾ sized printed circuit boards are denoted by 60*a*, 60*b*, and 60*c*, respectively. As illustrated as an example of combination of the printed circuit boards in FIG. 2, one ½ sized printed circuit board 60*b* and two ¼ sized printed circuit board 60*a* can be held in the bottom surface part 21-side stage of the frame 20.

Meanwhile, when the guide rail 50 is engaged with the rail holder 40, the guide rail 50 is slid and inserted from the front surface of the frame 20 toward the backboard 30 in a state in which the engagement parts 51*a* and 51*b* of the guide rail 50 are engaged with the engagement parts 43 and 44 of the rail holder 40. Now, when the sliding and inserting are started, a back end of the guide rail 50 contacts the bottom surface part 21 or the partition plate 25 around the front surface of the frame 20. Therefore, even if electric charges caused by, for example, static electricity are accumulated on the guide rail 50, the guide rail 50 is slid and inserted into the frame 20 after the accumulated electric charges are removed around the front surface of the frame 20. Thereby, the guide rail 50 in a state in which electric charges are accumulated does not contact the printed circuit board 60, the backboard 30, or the like around the inside of the frame 20 by mistake. Therefore, the printed circuit board 60, the backboard 30, or the like around the inside of the frame 20 is not made to malfunction, and is not damaged.

Furthermore, after the guide rail 50 is provided on the basis of the width dimension of the printed circuit board 60 as described above, the printed circuit board 60 is housed between the adjacent guide rails 50. The printed circuit board 60 is slid and inserted from the front surface of the frame 20 in a state in which the side edges of the printed circuit board 60 are held by the holding part 56 of the guide rail 50, and is housed. As illustrated in FIGS. 2 and 3, the printed circuit board 60*b* is illustrated in a state in the middle of being inserted, and the printed circuit board 60*a* is illustrated in a state where it has been inserted between the guide rails 50 and connected to the backboard 30 through the connectors 31. Similarly, as illustrated in FIG. 2, one ¼ sized printed circuit board 60*a* and one ¾ sized printed circuit board 60*c* can be housed in the partition plate 25-side stage of the frame 20.

As described above, the case of the electronic device according to this embodiment has a structure in which the rail holder is provided in the predetermined position preliminarily set in the frame, the guide rail is slid from the front of the frame toward the backboard to be attached and removed, and the printed circuit board is inserted between and removed from between the guide rails. Therefore, by selecting and changing the rail holder engaged with the guide rail, the printed circuit board having any size of ¼, ½, ¾, and 1 can be housed in the case. Additionally, printed circuit boards having each of the sizes can be freely used in combination. Therefore, in the case of using the electronic device as, for example, a communication device, the number of necessary channels can be arbitrarily changed among four, eight, twelve, and sixteen channels, and a configuration of the printed circuit boards for each electronic device can be optimized depending on user's needs. Furthermore, since a new case does not have to be redesigned, the production cost can be reduced.

Furthermore, in accordance with the case of the electronic device according to this embodiment, in the case of sliding and inserting the guide rail, when the sliding and inserting are started, the back end of the guide rail contacts the bottom surface part or the partition plate around the front surface of the frame to ensure removal of electricity in the guide rail. Therefore, in a state in which an electric power supply of the electronic device is powered on, the guide rail can be safely and readily attached and removed.

(First Variation of First Embodiment)

Next, with reference to FIGS. 8 and 9, a case of an electronic device according to a first variation of the first embodiment will be described.

Figure 8:
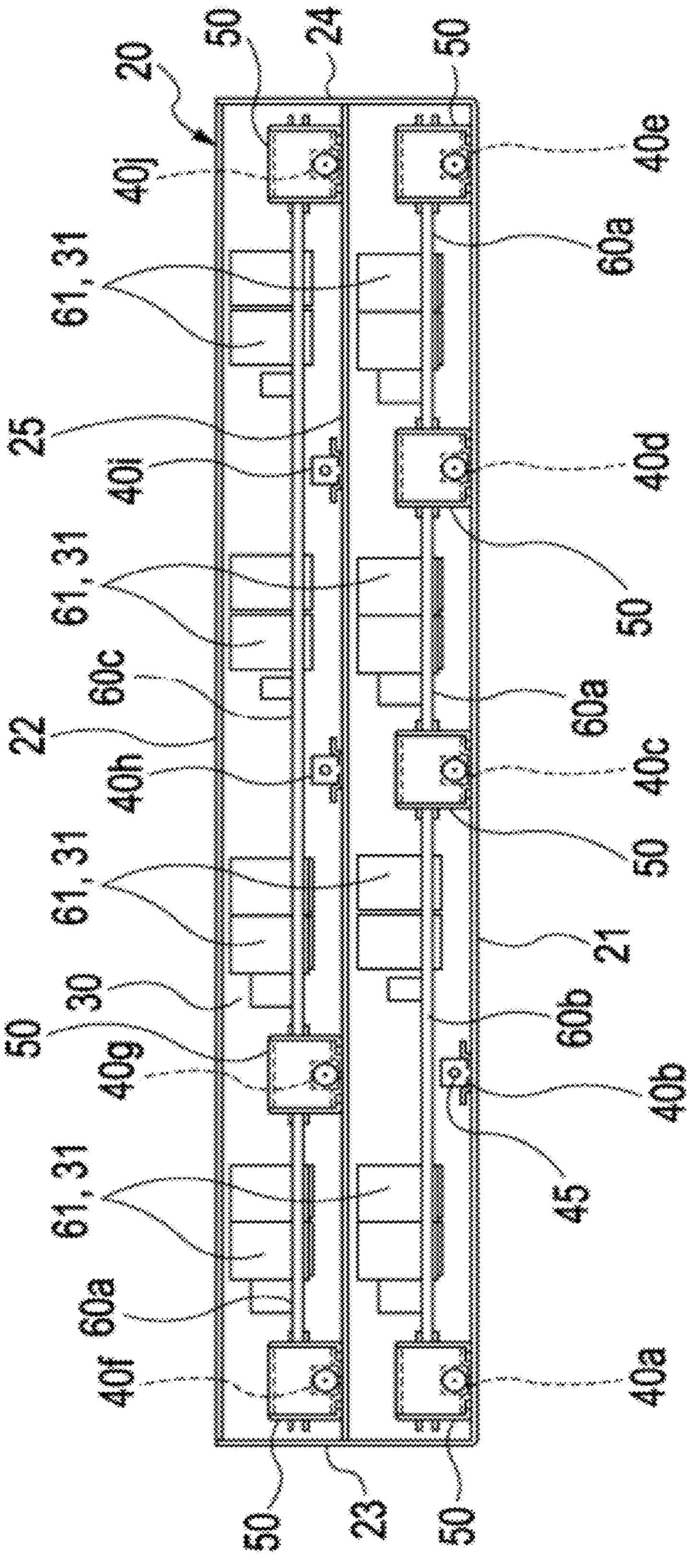
FIG. 8 is a front view illustrating a case of an electronic device according to a first variation of the first embodiment of the present invention.

FIG. 8 is a front view illustrating the case of the electronic device according to this variation. FIG. 9 is a plan view illustrating a configuration of a bottom surface part-side stage of the case of the electronic device illustrated in FIG. 8. However, in the following descriptions, the parts described above are given the same symbols, and descriptions thereof are omitted (the same is also true of the following variations and embodiments).

The case of the electronic device according to this variation differs from the first embodiment in that all guide rails have the same shape.

Figure 9:
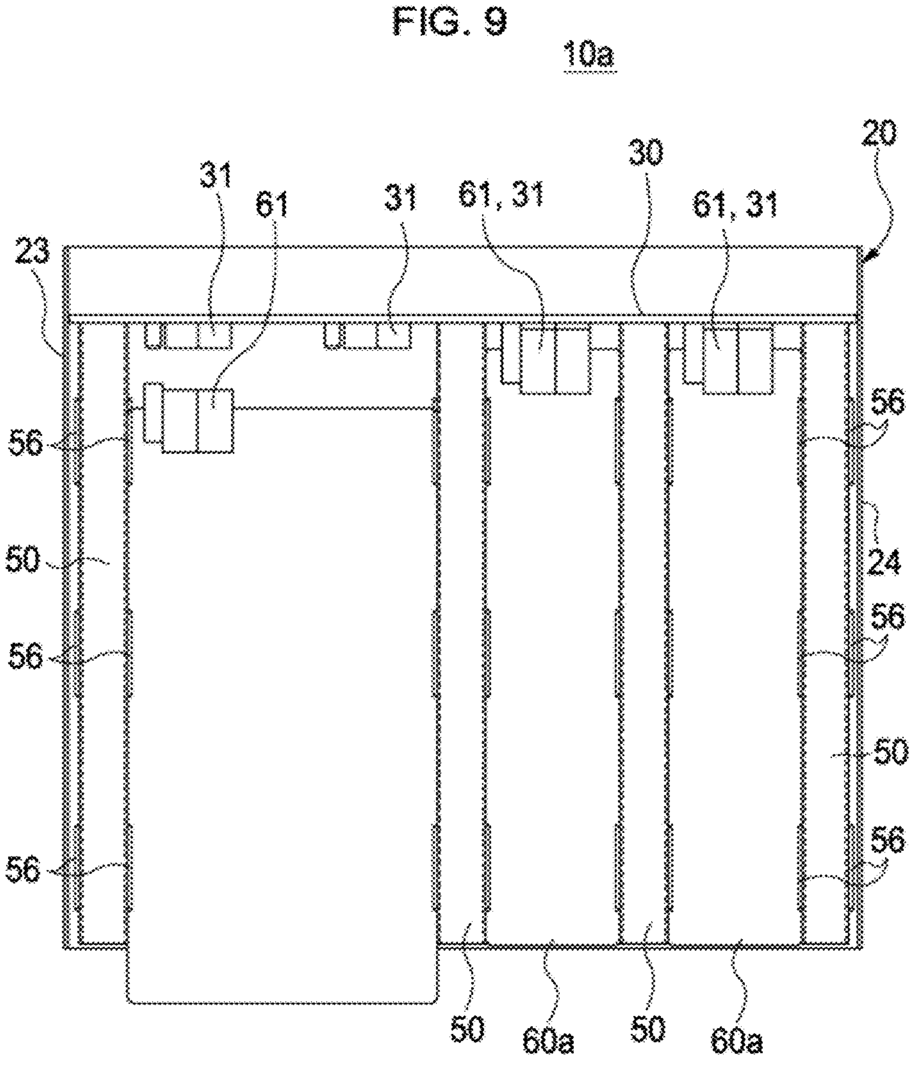
FIG. 9 is a plan view illustrating a configuration of a bottom surface part-side stage of the case of the electronic device illustrated in FIG. 8.

With reference to FIGS. 8 and 9, in the case 10*a* of the electronic device according to this variation, a frame 20, a backboard 30, and a rail holder 40 are the same as those of the first embodiment. Meanwhile, FIGS. 8 and 9 also illustrate printed circuit boards 60 housed by the case 10*a* of the electronic device.

On the other hand, in this variation unlike the first embodiment, all the guide rails 50 have the same shape. In the first embodiment, as illustrated in FIGS. 2, 50*a* and 50*b* at ends of the guide rails provided in a row in a bottom surface part 21-side stage and a partition plate 25-side stage in the frame 20 are provided with a holding part 56 on only one of side surface parts 53 and 54 of the guide rail. In contrast, in this variation, as illustrated in FIG. 8, all the guide rails are the guide rails 50 provided with the holding part 56 on both sides of the side surface parts 53 and 54.

In accordance with the case of the electronic device according to this variation, all the guide rails have the same shape, and the shape is standardized even at both ends in the case of providing the guide rails in a row. Therefore, the number of kinds of parts can be reduced, and the costs can be reduced.

(Second Variation of First Embodiment)

Next, with reference to FIGS. 10 and 11, a case of an electronic device according to a second variation of the first embodiment will be described.

Figure 10:
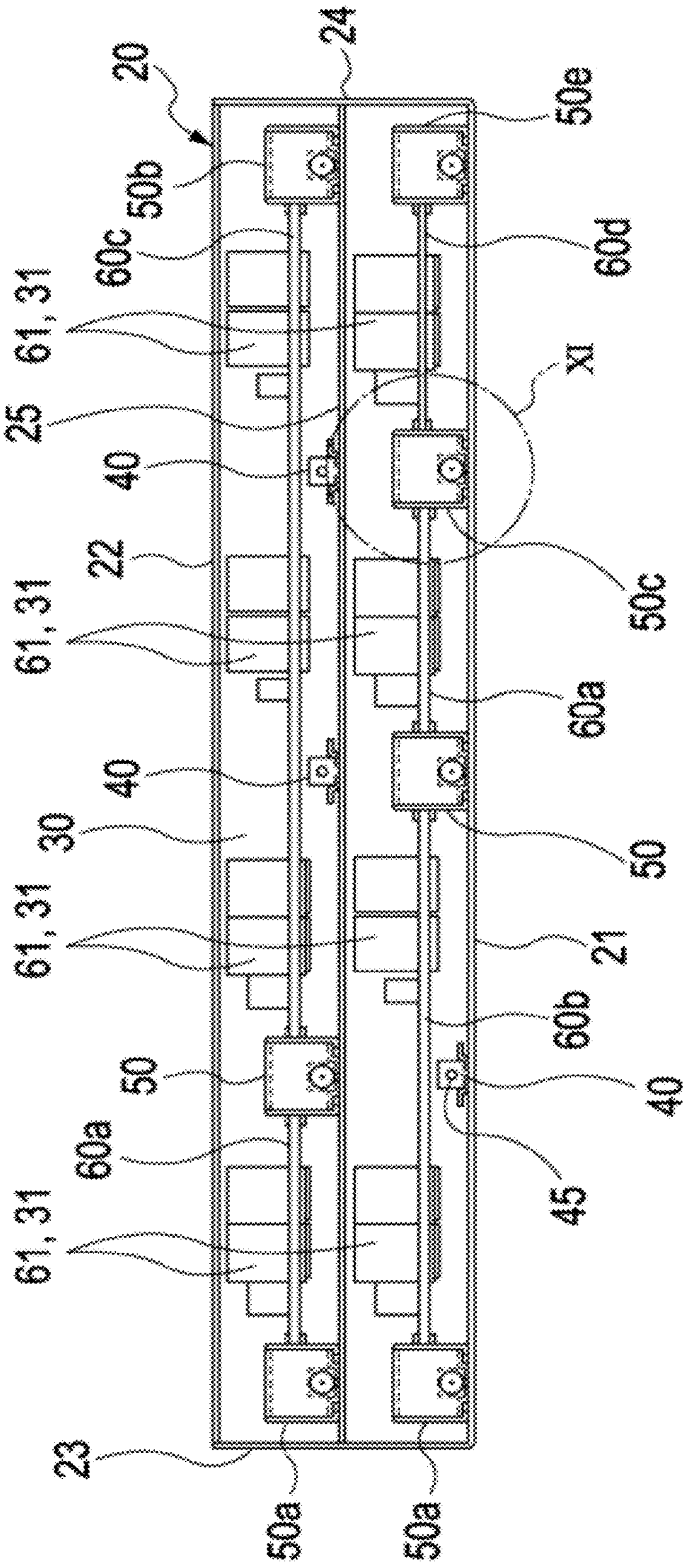
FIG. 10 is a front view illustrating a case of an electronic device according to a second variation of the first embodiment of the present invention.

FIG. 10 is a front view illustrating the case of the electronic device according to this variation. Additionally, FIG. 11 is a view enlarging and illustrating a part surrounded by a circle XI in FIG. 10.

The case of the electronic device according to this variation differs from the first embodiment in that holding parts on both of right and left sides of guide rails have shapes, different from each other, corresponding to a printed circuit board.

Figure 11:
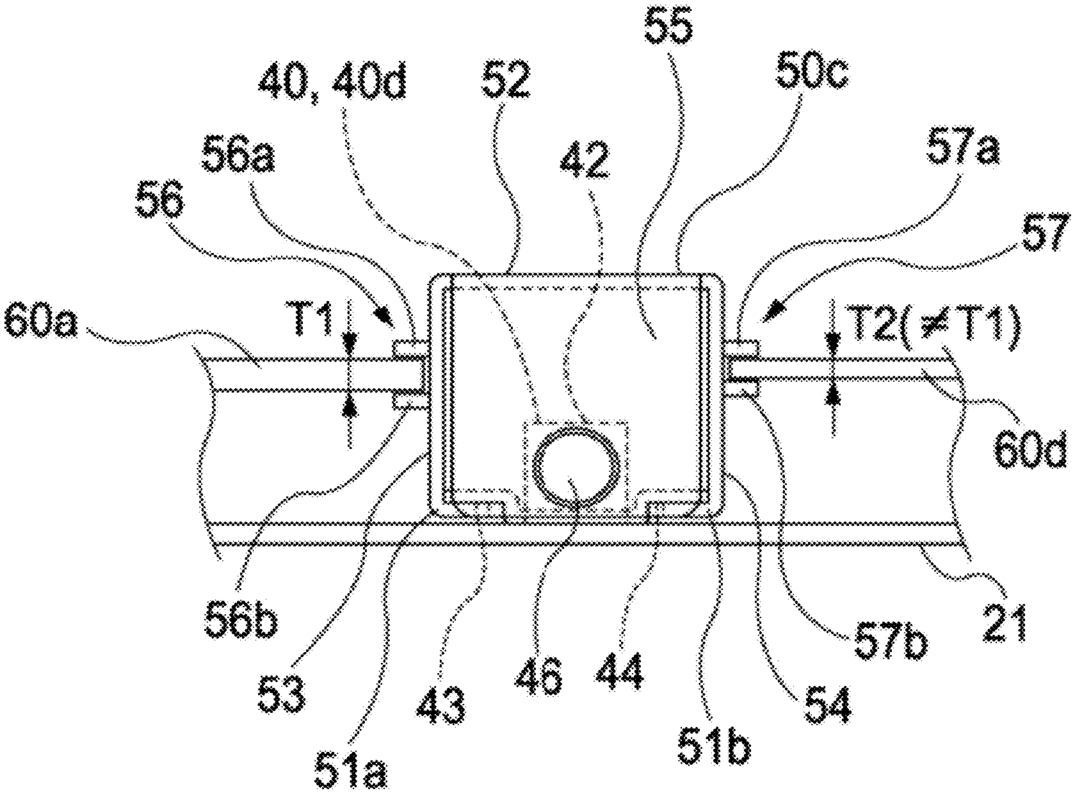
FIG. 11 is a view enlarging and illustrating a part surrounded by a circle XI in FIG. 10.

With reference to FIGS. 10 and 11, in the case 10*b* of the electronic device according to this variation, a frame 20, a backboard 30, and a rail holder 40 are similar to those of the first embodiment. Meanwhile, FIGS. 10 and 11 also illustrate the printed circuit boards 60 housed by the case 10*b* of the electronic device.

On the other hand, unlike the first embodiment, this variation includes the guide rails 50*c* in which pairs of holding members of the holding parts on both of the right and left sides have intervals different from each other. In the first embodiment, as illustrated in FIG. 2, all the intervals of the pairs of the holding members are equal in the holding parts 56 provided on the side surface parts 53 and 54 of the guide rails 50, 50*a* and 50*b*. In contrast, in this variation, as illustrated in FIG. 11, the guide rail 50*c* includes the holding parts 56 and 57 on the right and left sides, respectively, of the guide rail 50*c*, and the pair of the holding members 56*a* and 56*b* of the holding part 56 and the pair of the holding members 57*a* and 57*b* of the holding part 57 have intervals different from each other. As illustrated in FIG. 11, when the interval of the pair of the holding members of the left holding part 56 is T1, and the interval of the pair of the holding members of the right holding part 57 is T2, T1 and T2 are different from each other.

As illustrated in FIG. 11 as an example of this variation, the printed circuit boards 60*a* and 60*d* can have different substrate thicknesses at the right and left sides of the guide rail 50*c*. The printed circuit board 60*a* is the same as the ¼ sized printed circuit board 60*a* of the first embodiment. Additionally, a printed circuit board having a substrate thickness different from the substrate thickness of the printed circuit board 60*a* can be used as the printed circuit board 60*d*. In a printed-wiring print, the substrate thicknesses of 60*a* and 60*d* can be designed to arbitrary values. As an example, the substrate thickness of the printed circuit board 60*a* can be a thickness of 2.4 mm, and the substrate thickness of the printed circuit board 60*d* can be a thickness of 1.6 mm.

Additionally, in this variation, in order to fit a connector 61 provided on a top surface of the printed circuit board to the connectors 31 of the backboard 30, the top surface of the printed circuit board 60*a* and the top surface of the printed circuit board 60*d* can also be aligned at the same height. As illustrated in FIG. 11, in the holding parts 56 and 57 on the right and left sides of the guide rail 50*c*, the holding members 56*a* and 57*a* are provided at the same height, and the holding members 56*b* and 57*b* are provided at different heights.

In accordance with the case of the electronic device according to this variation, since a guide rail is used which accepts printed circuit boards having different substrate thicknesses, printed circuit boards having different substrate thicknesses can be used in combination in the electronic device.

(Third Variation of First Embodiment)

Next, with reference to FIGS. 12 to 14, a case of an electronic device according to a third variation of the first embodiment will be described.

Figure 12:
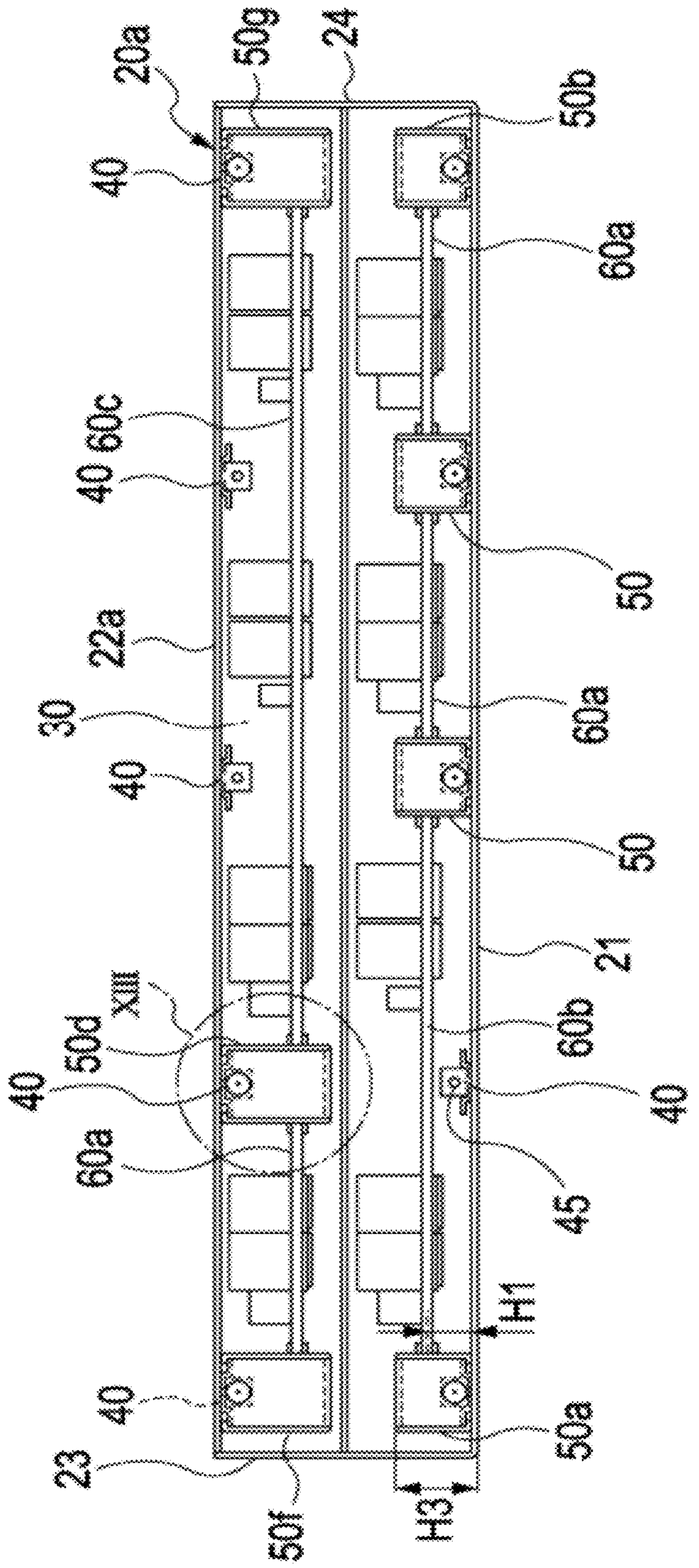
FIG. 12 is a front view illustrating a case of an electronic device according to a third variation of the first embodiment of the present invention.

FIG. 12 is a front view illustrating the case of the electronic device according to this variation. FIG. 13 is a view enlarging and illustrating a part surrounded by a circle XIII in FIG. 12. FIG. 14 is a front view illustrating a state in which printed circuit boards having a two-level structure are housed in the case of the electronic device according to this variation.

The case of the electronic device according to this variation differs from that of the first embodiment in that a partition plate is not provided in a frame, and a rail holder of a top surface part-side stage in the frame is provided on a top surface of the frame.

Figure 13:
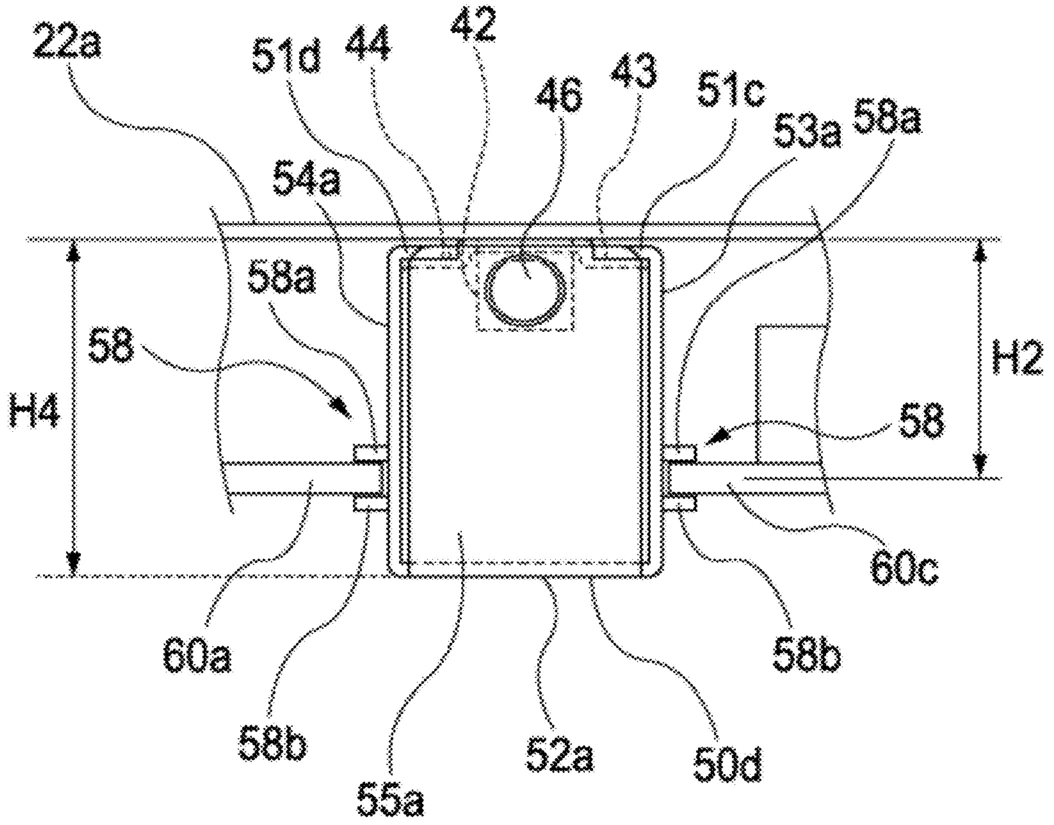
FIG. 13 is a view enlarging and illustrating a part surrounded by a circle XIII in FIG. 12.

With reference to FIGS. 12 and 13, the case 10*c* of the electronic device according to this variation includes a frame 20*a*, a backboard 30, a rail holder 40, and a guide rail 50. Meanwhile, FIG. 12 also illustrates printed circuit boards 60*a*, 60*b*, and 60*c* housed by the case 10*c* of the electronic device.

The frame 20*a* is the same as the first embodiment in that the frame 20*a* has a substantially rectangular O-shaped cross-sectional shape, and includes a bottom surface part 21, and side surface parts 23 and 24. However, the frame 20*a* differs from the frame 20 of the first embodiment in that the frame 20*a* does not include the partition plate 25. Additionally, the frame 20*a* differs from the frame 20 of the first embodiment in that the frame 20*a* includes a top surface part 22*a* provided with a rail holder 40, described below, upside down.

The same backboard 30 as in the first embodiment can be used.

The same rail holder 40 as in the first embodiment can be used in a bottom surface part 21-side stage of the frame 20*a*. On the other hand, in the top surface part 22*a*-side stage of the frame 20*a*, unlike the first embodiment, the rail holder 40 is provided on the top surface part 22*a* of the frame 20*a* upside down. The rail holder 40 provided upside down can also have a different shape from the rail holder 40 in the bottom surface part 21-side stage of the frame 20*a*.

The same guide rail 50 as in the first embodiment can be used in the bottom surface part 21-side stage of the frame 20*a*. On the other hand, in the top surface part 22*a*-side stage of the frame 20*a*, unlike in the first embodiment, the guide rails 50*d*, 50*f*, and 50*g* are provided on the top surface part 22*a* of the frame 20*a* in a downward direction.

As illustrated in FIG. 13, the guide rail 50*d* includes a bottom surface part 52*a*, engagement parts 51*c* and 51*d*, side surface parts 53*a* and 54*a*, and a front surface part 55*a*. The bottom surface part 52*a* is provided on a bottom surface of the guide rail 50*d*, extends from the front surface of the frame 20*a* toward the backboard 30 similarly to the top surface part 52 of the guide rail 50, and is a part having a long rectangular shape. The side surface parts 53*a* and 54*a* are provided on right and left side surfaces of the guide rail 50*d* as viewed from the front surface of the frame 20*a*, extend from the front surface of the frame 20*a* toward the backboard 30, and are parts having a long rectangular shape. Additionally, the side surface parts 53*a* and 54*a* are provided with a holding part 58 holding a side edge of the printed circuit board 60 between both the main face and the reverse face of the printed circuit board 60. It is similar to the first embodiment in that the holding part 58 is provided with a pair of holding members 58*a* and 58*b* provided at an interval corresponding to the substrate thickness of the printed circuit board 60 on the side surface parts 53*a* and 54*a* from the front surface of the frame 20*a* toward the backboard 30. Additionally, it is also similar to the first embodiment in that the holding part 58 may also be provided so as to be divided into a plurality of pieces along a direction from the front surface of the frame 20*a* toward the backboard 30. However, a height H1 from the bottom surface part 21 of the frame 20 to a center of the holding part 56 of the guide rail 50 illustrated in FIG. 6 is different from a height H2 from the top surface part 22*a* of the frame 20*a* to a center of the holding part 58 of the guide rail 50*d* illustrated in FIG. 13. Therefore, a height H3 of the side surface parts 53 and 54 of the guide rail 50 illustrated in FIG. 6 is different from a height H4 of the side surface parts 53*a* and 54*a* of the guide rail 50*d* illustrated in FIG. 13.

In accordance with the case of the electronic device according to this variation, the partition plate between the printed circuit boards is omitted, and the rail holders are provided on the bottom surface and the top surface of the frame so as to face each other. Therefore, the printed circuit board can be housed in the frame without dimensional constraint on an electronic circuit (IC) mounted on the housed printed circuit board and without dimensional constraint on the substrate thickness of the printed circuit board due to existence of the partition plate.

Figure 14:
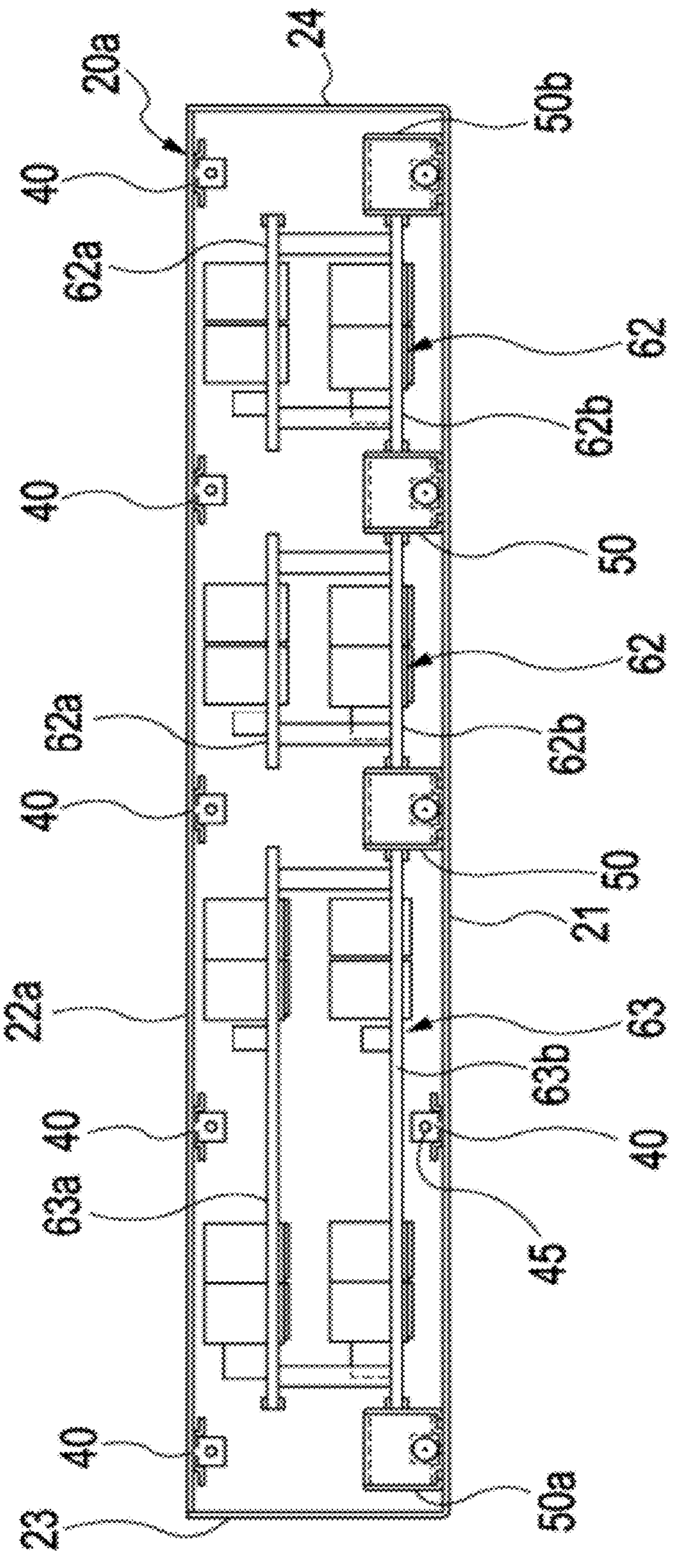
FIG. 14 is a front view illustrating a state in which two-level structure printed circuit boards are housed in the case of the electronic device according to the third variation of the first embodiment of the present invention.

Particularly, as illustrated in FIG. 14, the case of the electronic device according to this variation can house a printed circuit board having a large height dimension. With reference to FIG. 14, in the case 10*c* of the electronic device, the guide rail is not provided on the rail holder 40 of the top surface part 22*a* of the frame 20*a*, and the guide rail 50 is provided only on the rail holder 40 of the bottom surface part 21 of the frame 20*a*. As a result, the case 10*c* of the electronic device can house two-level structure printed circuit boards in which two printed circuit boards are separated into two upper and lower layers to be located, by, for example, holding a side edge of the printed circuit board of the lower layer. As illustrated in FIG. 14, for example, two-level structure ¼ sized printed circuit boards 62 can be housed in which two ¼ sized printed circuit boards 62*a* and 62*b* are separated into two upper and lower layers and located. Similarly, two-level structure ½ sized printed circuit boards 63 can be housed in which two ½ sized printed circuit boards 63*a* and 63*b* are separated into two upper and lower layers and located.

(Second Embodiment)

Next, with reference to FIG. 15, a case of an electronic device according to a second embodiment will be described.

Figure 15:
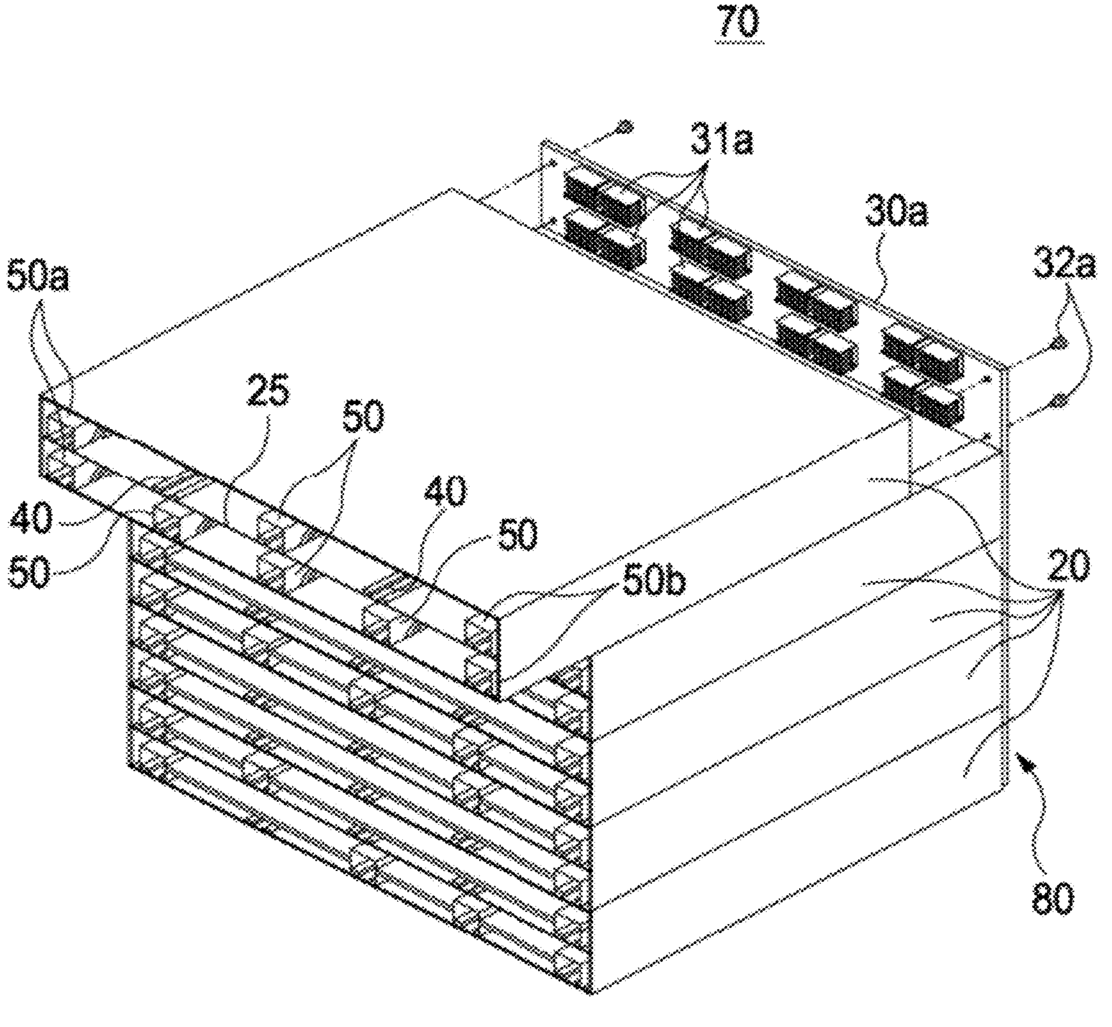
FIG. 15 is a partially exploded perspective view illustrating a case of an electronic device according to a second embodiment of the present invention.

FIG. 15 is a partially exploded perspective view illustrating the case of the electronic device according to this embodiment.

The case of the electronic device according to this embodiment differs from that of the first embodiment in that a plurality of frames are formed in the stack.

With reference to FIG. 15, the case 70 of the electronic device according to this embodiment includes a frame assembly 80 in which a plurality of frames 20 are stacked, a backboard 30*a*, a rail holder 40, and a guide rail 50.

The frame assembly 80 is formed by stacking the plurality of frames 20 in the first embodiment. FIG. 15 illustrates the frame assembly 80 in which the frames 20 are stacked one above the other in five stages.

The backboard 30*a* is provided at a back surface of the frame assembly 80. Unlike in the first embodiment, the backboard 30*a* is not provided for each frame 20, but is an extended backboard integrally provided at the back surface of the frame assembly 80. The back surface of each of the frames 20 is screwed to the backboard 30*a* by using a screw 32*a*. The backboard 30*a* is also provided with a connector 31*a* corresponding to the printed circuit board 60 housed in each frame 20.

The rail holder 40 and the guide rail 50 are the same as those in the first embodiment. The second embodiment is also the same as the first embodiment in that the printed circuit boards 60 including ¼, ½, ¾, and 1 sized printed circuit boards 60*a*, 60*b*, and 60*c* are housed between the guide rails 50.

In accordance with the case 70 of the electronic device according to this embodiment, the frames 20 of the case 10 of the electronic device according to the first embodiment are stacked in the plurality of stages, and each of the stacked frames 20 is screwed to the extended backboard 30*a*. Thereby, for example, a large electronic device such as a large-capacity communication device capable of increasing its capacity or expanding its functions can be provided.

In this embodiment, the situation of stacking the frames 20 of the case 10 of the electronic device according to the first embodiment in the plurality of stages in a state in which the rail holder 40 and the guide rail 50 are provided is illustrated. However, the second embodiment is not restricted to the frames 20 of the case 10 of the electronic device according to the first embodiment. Therefore, the frames 20 of the case 10*a* of the electronic device according to the first variation of the first embodiment may be stacked in the plurality of stages in a state in which the guide rail 50 is provided. Additionally, the frames 20 of the case 10*b* of the electronic device according to the second variation of the first embodiment may be stacked in the plurality of stages in a state in which the guide rail 50*c* is provided. Furthermore, the frames 20*a* of the case 10*c* of the electronic device according to the third variation of the first embodiment may be stacked in the plurality of stages in a state in which the rail holder 40 and the guide rail 50*d* are provided.

(Third Embodiment)

Next, with reference to FIGS. 16 to 19, a case of an electronic device according to a third embodiment will be described.

Figure 16:
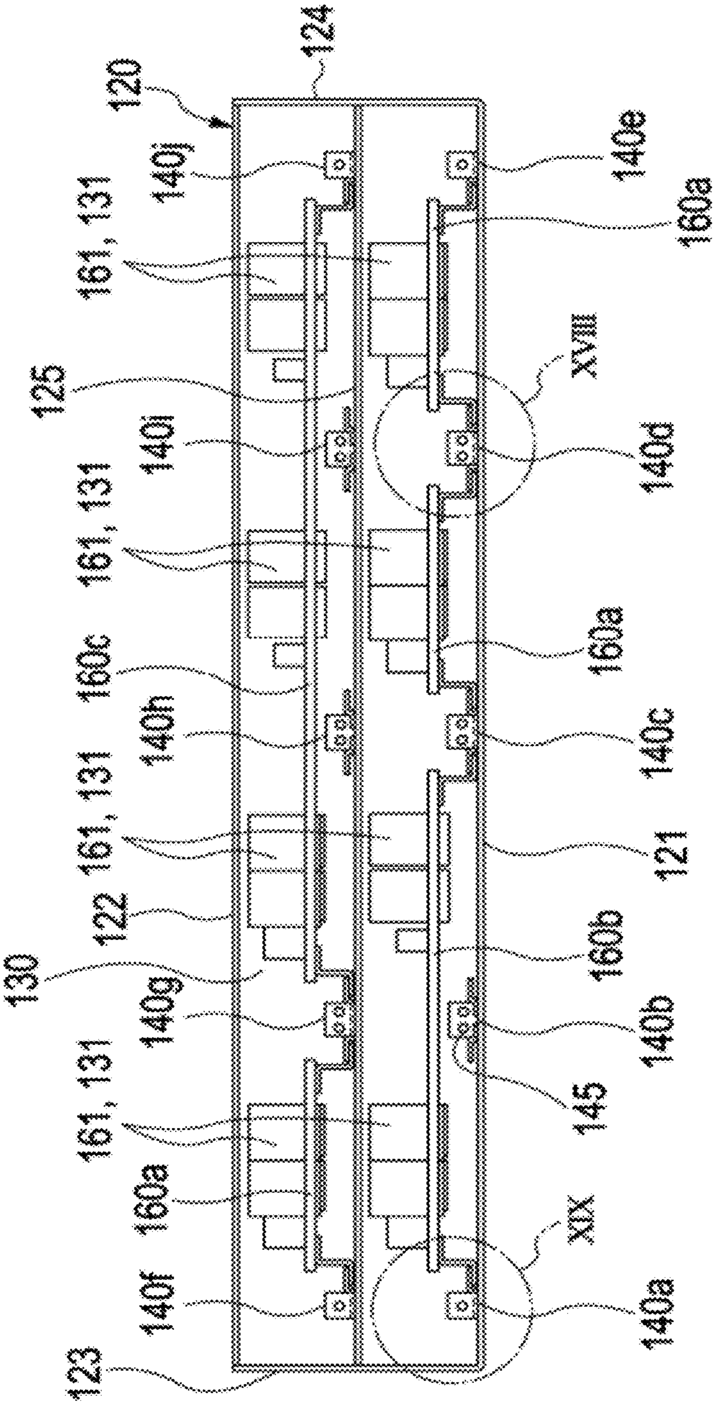
FIG. 16 is a front view illustrating a case of an electronic device according to a third embodiment of the present invention.
Figure 17:
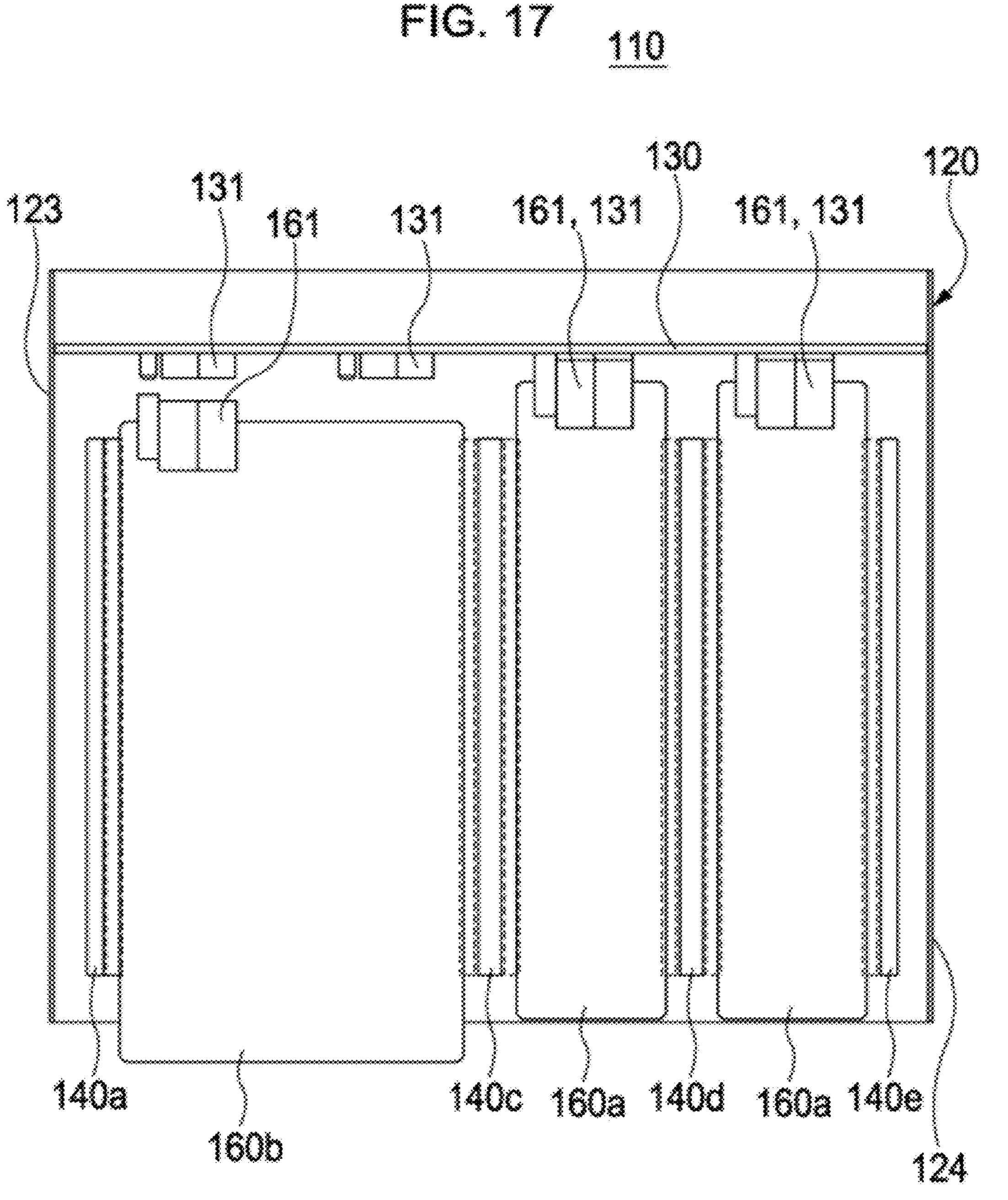
FIG. 17 is a plan view illustrating a configuration of a bottom surface part-side stage of the case of the electronic device illustrated in FIG. 16.
Figure 18:
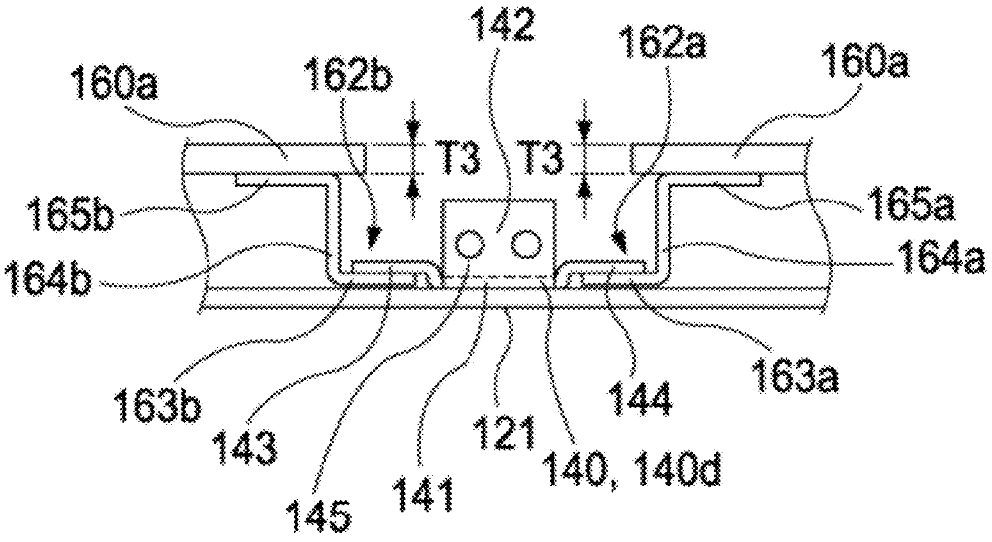
FIG. 18 is a view enlarging and illustrating a part surrounded by a circle XVIII in FIG. 16.
Figure 19:
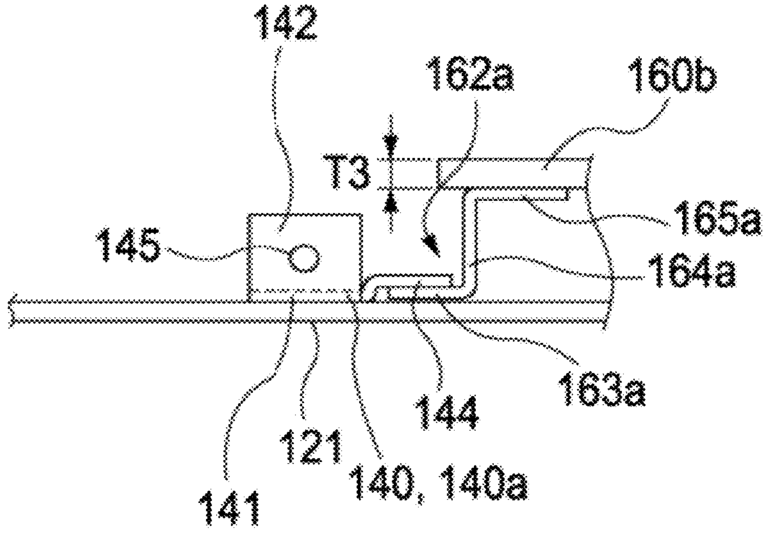
FIG. 19 is a view enlarging and illustrating a part surrounded by a circle XIX in FIG. 16.

FIG. 16 is a front view illustrating the case of the electronic device according to this embodiment. FIG. 17 is a plan view illustrating a configuration of a bottom surface part-side stage of the case of the electronic device illustrated in FIG. 16. FIG. 18 is a view enlarging and illustrating a part surrounded by a circle XVIII in FIG. 16. FIG. 19 is a view enlarging and illustrating a part surrounded by a circle XIX in FIG. 16.

The case of the electronic device according to this embodiment does not include the guide rail of the first embodiment, but instead, a printed circuit board includes a part corresponding to the engagement part of the guide rail, which is different from the first embodiment. Meanwhile, since it includes a printed circuit board, the case of the electronic device according to this embodiment also functions as an electronic device.

With reference to FIG. 16, the case 110 of the electronic device according to this embodiment includes a frame 120, a backboard 130, a rail holder 140, and a printed circuit board 160.

The frame 120, the backboard 130, and the rail holder 140 are the same as the frame 20, the backboard 30, and the rail holder 40, respectively, of the first embodiment. The frame 120 includes a bottom surface part 121, a top surface part 122, side surface parts 123 and 124, and a partition plate 125, and is the same as the frame 20 that includes the bottom surface part 21, the top surface part 22, the side surface parts 23 and 24, and the partition plate 25 in the first embodiment. The third embodiment is the same as the first embodiment in that the backboard 130 includes a connector 131, and the printed circuit board 160 includes a connector 161. As illustrated in FIGS. 16, 17, and 18, the rail holder 140 includes a bottom plate part 141, a front plate part 142, and engagement parts 143 and 144. The bottom plate part 141, the front plate part 142, and the engagement parts 143 and 144 are the same as the bottom plate part 41, the front plate part 42, and the engagement parts 43 and 44 of the first embodiment. As illustrated in FIG. 16, as an example, the rail holders 140 can be configured to be provided as five rail holders 140*a*, 140*b*, 140*c*, 140*d*, and 140*e* on the bottom surface part 121 of the frame 120, and to be provided as five rail holders 140*f*, 140*g*, 140*h*, 140*i*, and 140*j* on the partition plate 125 of the frame 120. However, since they are provided at ends of five rail holders, the rail holders 140*a*, 140*e*, 140*f*, and 140*j* may have such a shape that includes only one engagement part of the engagement parts 143 and 144 on sides centered on the bottom plate part 141 as illustrated in FIG. 19.

On the other hand, in this embodiment, unlike the first embodiment, the printed circuit board 160 includes engagement parts 162*a* and 162*b* engaged with the rail holder 140. As illustrated in FIG. 18, the engagement parts 162*a* and 162*b* include engagement members 163*a* and 163*b* engaged with the engagement parts 143 and 144 of the rail holder 140, spacer members 164*a* and 164*b* keeping the printed circuit board 160 at a predetermined height from the bottom surface part 121 or the partition plate 125 of the frame 120, and attachment members 165*a* and 165*b* attaching the printed circuit board 160 to the engagement parts 162*a* and 162*b*. Additionally, for example, members forming the engagement members 163*a* and 163*b*, the spacer members 164*a* and 164*b*, and the attachment members 165*a* and 165*b* by integral metal or the like bent at two positions can be used as the engagement parts 162*a* and 162*b*, respectively.

Additionally, similarly to the first embodiment, the ¼, ½, and ¾ sized printed circuit boards are denoted by 160*a*, 160*b*, and 160*c*, respectively. Additionally, as illustrated by an example in FIG. 16, two ¼ sized printed circuit boards 160*a* and one ½ sized printed circuit board 160*b* can be housed in the bottom surface part 121-side stage of the frame 120.

Additionally, one ¼ sized printed circuit board 160*a* and one ¾ sized printed circuit board 160*c* can be housed in the top surface part 122-side stage of the frame 120.

In accordance with the case of the electronic device according to this embodiment, instead of using the removable guide rail, the engagement part is attached to the printed circuit board, and the printed circuit board is inserted and removed from the front surface side of the frame so as to engage the engagement part to the rail holder preliminarily fixed in the predetermined position of the frame. Thereby, the production cost of the electronic device can be reduced.

Meanwhile, in the second embodiment, the case 70 of the electronic device is configured by stacking the plurality of frames 20 of the case 10 of the electronic device. Similarly, in this embodiment, the case of the electronic device may also be configured by stacking the plurality of frames 120 of the case 110 of the electronic device in a state in which the rail holder 140 and a printed circuit board 160 are provided. In accordance with such a case of the electronic device, for example, a large electronic device such as a large-capacity communication device capable of increasing its capacity or expanding its functions can be provided.

(Variation of Third Embodiment)

Next, with reference to FIGS. 20 and 21, a case of an electronic device according to a variation of the third embodiment will be described.

Figure 20:
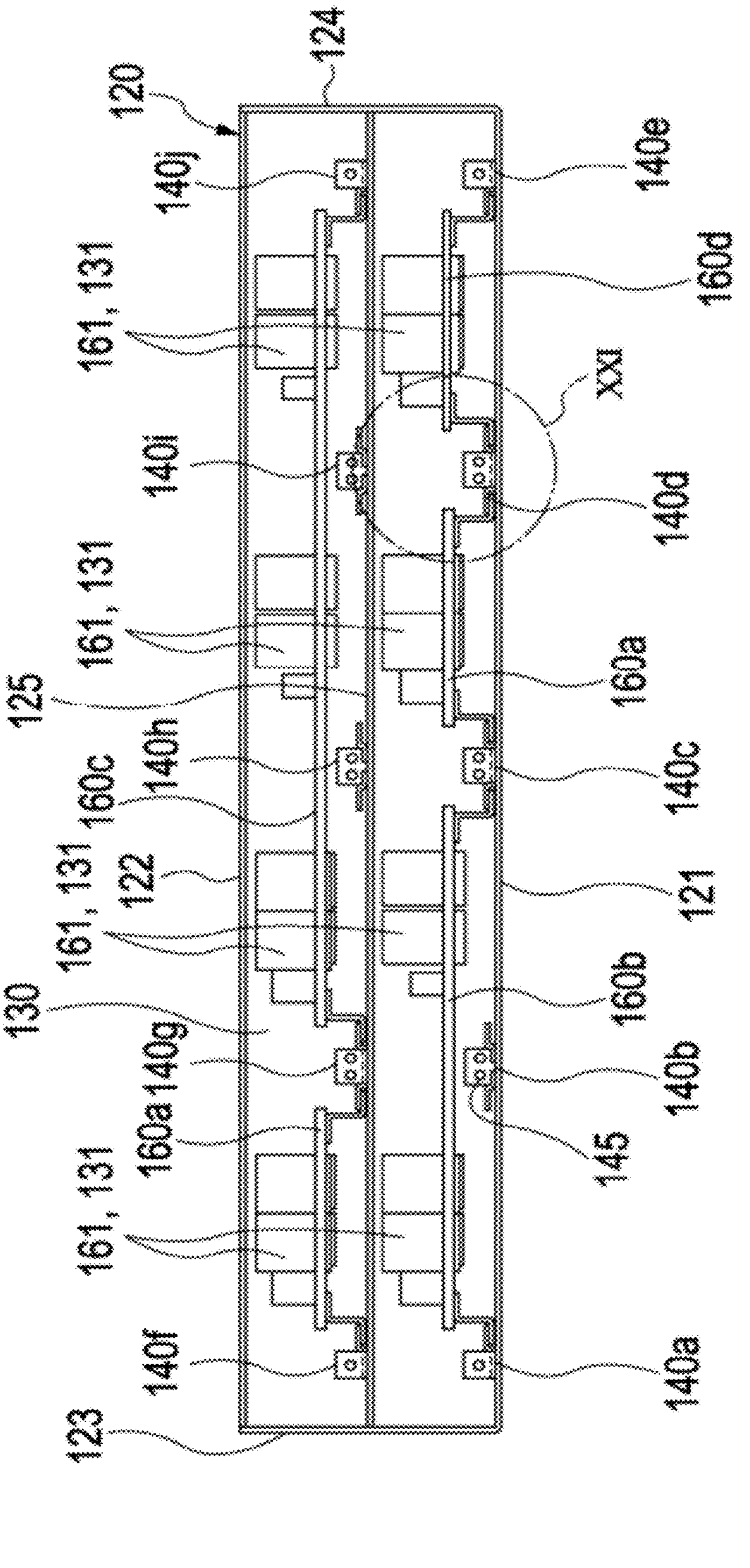
FIG. 20 is a front view illustrating a case of an electronic device according to a variation of the third embodiment of the present invention.

FIG. 20 is a front view illustrating the case of the electronic device according to this variation. Additionally, FIG. 21 is a view enlarging and illustrating a part surrounded by a circle XXI in FIG. 20.

The case of the electronic device according to this variation differs from that of the third embodiment in that printed circuit boards having different substrate thicknesses include engagement parts having different heights. Additionally, since it includes a printed circuit board, the case of the electronic device according to this variation also functions as an electronic device.

Figure 21:
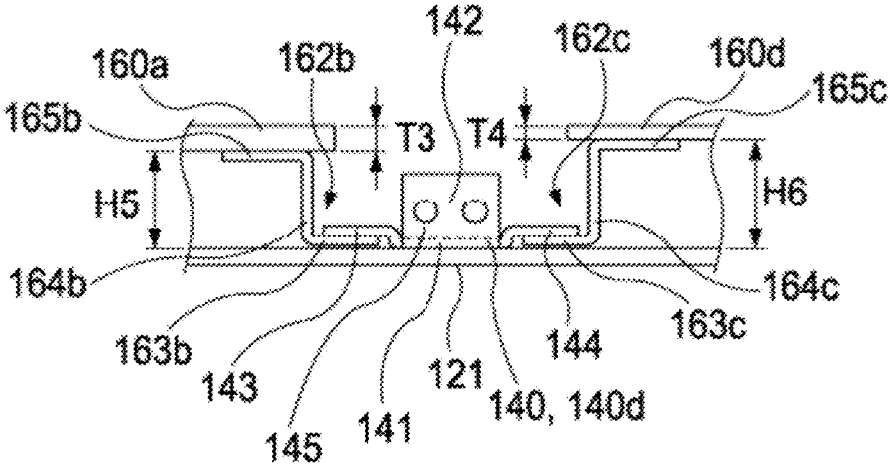
FIG. 21 is a view enlarging and illustrating a part surrounded by a circle XXI in FIG. 20.

With reference to FIGS. 20 and 21, in the case 110*a* of the electronic device according to this variation, a frame 120, a backboard 130, and a rail holder 140 are similar to those of the third embodiment.

On the other hand, unlike that of the third embodiment, the case 110*a* of the electronic device according to this variation includes the printed circuit boards having substrate thicknesses different from each other. In the third embodiment, as illustrated in FIGS. 18 and 19, all the substrate thicknesses of the printed circuit boards 160*a*, 160*b*, and 160*c* are equal. In contrast, as illustrated in FIGS. 20 and 21, this variation includes a printed circuit board 160*d* having the same size of ¼ as the printed circuit board 160*a* and a different substrate thickness. When the substrate thickness of the printed circuit board 160*a* is T3, and the substrate thickness of the printed circuit board 160*d* is T4, T3 and T4 are different from each other. As an example, the substrate thickness of the printed circuit board 160*a* can be 2.4 mm, and the substrate thickness of the printed circuit board 160*d* can be 1.6 mm.

Additionally, in this variation, in order to fit a connector 161 provided on a top surface of the printed circuit board 160 to the connectors 131 of the backboard 130, the top surface of the printed circuit board 160*a* and the top surface of the printed circuit board 160*d* can be aligned at the same height. As illustrated in FIG. 21, when the height of the spacer members 164*b* of the engagement part 162*b* of the printed circuit board 160*a* is H5, and the height of the spacer members 164*c* of the engagement part 162*c* of the printed circuit board 160*d* is H6, the height H6 is different from the height H5, which is provided so as to satisfy the relationship of T3+H5=T4+H6.

In accordance with the case of the electronic device according to this variation, since the engagement parts having different heights corresponding to the substrate thicknesses of the printed circuit boards are attached and used so as to house the printed circuit boards having different substrate thicknesses with the same height of the top surfaces of the substrates, the printed circuit boards having different substrate thicknesses can be used in combination in the electronic device.

Meanwhile, in this variation, the electronic device may also be configured by stacking the plurality of frames 120 of the case 110*a* of the electronic device in a state in which the rail holder 140 and a printed circuit board 160 are provided. In accordance with such a case of the electronic device, for example, a large electronic device such as a large-capacity communication device capable of increasing its capacity or expanding its functions can be provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A case for an electronic device, comprising:

a frame capable of storing a printed circuit board;

a back board equipped on a back side of the frame, the back board including a connector for connecting the printed circuit board;

rail holders equipped in predetermined positions of the frame and extending from a front side of the case to the back board; and guide rails engaged with the rail holders respectively, the guide rails including engagement parts capable of engaging with the rail holders and holding parts extending in accordance with the rail holders, the guide rails being configured to be attached to the rail holders through the corresponding engagement parts so as to be slid and inserted into the rail holders at the engagement parts, respectively, the holding parts being configured to hold ends of the printed circuit board.

2. The case of claim 1, further comprising a plurality of the frames, wherein each of the frames are capable of storing the printed circuit board by the use of the rail holders and the guide rails.

3. The case of claim 1, wherein the holding parts contact two surfaces of the printed circuit board.

4. The case of claim 1, wherein the rail holders are arranged in accordance with a width of the printed circuit board.

5. The case of claim 1, wherein at least one holding part is arranged on each of two sides of the guide rails, and have shapes in accordance with side shapes of the printed circuit board.

6. The case of claim 5, wherein each of the holding parts has a couple of holding members oppositely arranged in accordance with thickness of the printed circuit board, and has a shape in accordance with a side shape of the printed circuit board.

7. The case of claim 1, wherein the guide rails are similar in shape.

8. The case of claim 1, further comprising a partition plate being arranged between a bottom face of the frame and a top face of the frame;

wherein the rail holders are arranged on the partition plate and the bottom face of the frame.

9. The case of claim 1, wherein the rail holders are oppositely arranged on a bottom face of the frame and top face of the frame.

10. The case of claim 9, wherein the guide rails are locked by the rail holders.

11. The case of claim 1, wherein the guide rails are conductors.

12. An electronic device including a case, comprising:

a printed circuit board;

a frame capable of storing the printed circuit board;

a back board equipped on a back side of the frame, the back board including a connector for connecting the printed circuit board;

rail holders equipped in predetermined positions of the frame and extending from a front side of the case to the back board;

guide rails engaged with the rail holders respectively, the guide rails including engagement parts capable of engaging with the rail holders and holding parts extending in accordance with the rail holders, the guide rails being configured to be attached to the rail holders through the corresponding engagement parts so as to be slid and inserted into the rail holders at the engagement parts, respectively, the holding parts being configured to hold ends of the printed circuit board.

13. The electronic device of claim 12, further comprising a plurality of the frames, wherein each of the frames are capable of storing the printed circuit board by the use of the rail holders and the guide rails.

14. The electronic device of claim 12, wherein at least one holding part is arranged on each of two sides of the guide rails and each of the holding parts has a couple of holding members oppositely arranged in accordance with thickness of the printed circuit board.

15. The electronic device of claim 12, further comprising a partition plate being arranged between a bottom face of the frame and a top face of the frame;

wherein the rail holders are arranged on the partition plate and the bottom face of the frame.

16. The electronic device of claim 12, wherein the guide rails are conductors.

* * * * *